United States Patent [19]

Oguchi

[11] Patent Number: 4,520,097
[45] Date of Patent: May 28, 1985

[54] NEGATIVE-TYPE RESIST SENSITIVE TO IONIZING RADIATION

[76] Inventor: Kiyoshi Oguchi, 252-2, Mizuno, Sayama-Shi, Saitama-Ken, Japan

[21] Appl. No.: 432,448

[22] Filed: Oct. 4, 1982

[30] Foreign Application Priority Data

Oct. 9, 1981 [JP] Japan ................................ 56-161431

[51] Int. Cl.$^3$ ........................... G03C 1/71; G03C 1/70
[52] U.S. Cl. .................................... 430/280; 430/270; 430/283; 525/423; 525/432; 528/341; 528/421; 204/159.19
[58] Field of Search ................ 430/270, 280, 906, 909, 430/296, 311, 313; 204/159.19; 528/341, 421; 525/423, 432, 283

[56] References Cited

U.S. PATENT DOCUMENTS

Re. 26,018  5/1966  Loshaek et al. ...................... 525/421

FOREIGN PATENT DOCUMENTS 77056  4/1983  European Pat. Off. ............ 430/283

OTHER PUBLICATIONS

Hiroyuki Nakamura et al., "Synthesis of Polyamides having Perhydro-azepine Units," *Journal of Polymer Science: Polymer Chemistry Edition*, vol. 16, pp. 3035–3038 (1978).

Aaron W. Levine et al., "Interaction of 5-keV Electrons with Isocyanate Homopolymers", *Journal of Polymer Science: Polymer Chemistry Edition*, vol. 11, 1973, pp. 311–313.

Naoya Ogata et al., "Relationship Between Electron Sensitivity and Chemical Structure of Polymers as E B Resists, I. Electron Sensitivity of Various Polyamides,"
*Journal of Applied Polymer Science*, vol. 28, 1983, pp. 699–708.

*Chemical Abstracts*, vol. 91, No. 3, Jul. 16th 1979, p. 656, No. 30458b, Columbus Ohio (USA); Y. Shimokawa et al., "Studies on Electron–crosslinkable Polymers, I. Electron–and Photosensitivity of N–allyloxymethylated Polyamide", *Kobunshi Ronbunshu, 1979*, vol. 36, No. 3, pp. 196–174 (Japanese).

*Encyclopaedia Chimica*, p. 594, 1974.

Fred W. Billmeyer, Jr., *Textbook of Polymer Science*, (John Wiley & Sons, Inc., New York, NY, 1962) p. 432.

Brandrup, J. and E. H. Immergut (eds.), *Polymer Handbook (2nd ed.)*, (John Wiley & Sons, Inc., New York, NY, 1975) IV-254 to IV-255.

*Primary Examiner*—John E. Kittle
*Assistant Examiner*—Cynthia Hamilton
*Attorney, Agent, or Firm*—Stevens, Davis, Miller & Mosher

[57] ABSTRACT

A polyamide polymer having recurring units represented by the formula:

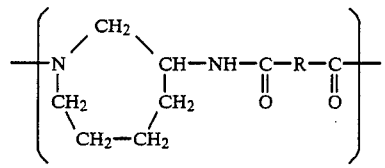

wherein R represents at least one divalent organic group, has excellent characteristics such as high sensitivity, high resolving power and excellent dry etching resistance suitable as a negative-type resist in ionizing radiation lithography.

5 Claims, No Drawings

NEGATIVE-TYPE RESIST SENSITIVE TO IONIZING RADIATION

TECHNICAL FIELD

This invention relates to a resist material suitable for fine pattern formation to be used in the lithographic process during manufacture of a high density integrated circuit such as LSI or ultra LSI, etc., or a photomask useful for production thereof. More particularly, it pertains to a novel negative-type resist material which has a high sensitivity and a high resolving power with respect to ionizing radiation and can produce a resist film of excellent etching resistance after hardening.

BACKGROUND ART

As is well known in the art, the demand for higher performance as well as higher degree of integration of semiconductor integrated circuits is ever increasing in these years. For this reason, as a lithographic technique, in place of the photolithography employing ultra-violet rays of the prior art, efforts have been made to establish an ultra-fine pattern working technique by the use of ionizing radiation of higher energy with shorter wavelength, namely, an electron beam, soft X-rays, an ion beam, etc.

On the other hand, for enabling an ultra-fine lithography by such a change of radiation source, the resist material to be used must have corresponding characteristics. Generally speaking, the resist material to be used in ultrafine lithography with the use of a high energy ionizing radiation is required to have the following characteristics:

(a) High sensitivity to an ionizing radiation;
(b) High resolving power;
(c) Capability of forming a uniform thin film;
(d) Excellent resistance to dry etching so that dry etching which is essential for high density micropatternization may be applicable; and
(e) Excellent developing characteristics.

In the prior art, a great number of resists sensitive to ionizing radiations have been developed to be used for the above purpose. These resists may be classified into the positive-type in which the irradiated portion disintegrates to be solubilized by irradiation of an ionizing radiation and the negative-type in which the irradiated portion undergoes crosslinking to be insolubilized by irradiation of an ionizing radiation.

Of these, the positive-type resists entail difficulty with selection of developers because generally a narrow scope of developers have characteristics adapted therefor and also suffer from the drawback of weak resistance to dry etching. In contrast, most of the negative-type resists are superior in these respects to the positive-type ones.

Representative of the negative-type resists developed in the prior art are the polyglycidyl methacrylate type, glycidyl methacrylate-ethyl acrylate copolymer type, and unsaturated carboxylic acid-methacrylate copolymer type. However, these negative-type resists have some drawbacks in practical application and cannot be said to be satisfactory. For example, a glycidyl methacrylate type resist, while having a high sensitivity, has a low resolution, practically as low as only about 2.0 μm, due to generation of a large amount of scum at the brim portions of the drawn image pattern. Moreover, each of the above resists has low dry etching resistance (with too much or too fast reduction in film thickness during dry etching) and therefore has a disadvantage in that it is difficult to apply thereto a dry etching process which is indispensable for high-density micropatternization.

SUMMARY OF THE INVENTION

In view of the state of the art as described above, an object of the present invention is to provide a novel negative-type resist sensitive to ionizing radiation which has high sensitivity and excellent dry etching resistance, and is also capable of attaining a high degree of resolution.

Thus, the present invention, according to a principal aspect thereof, provides a negative-type resist sensitive to ionizing radiation which comprises a polyamide polymer having recurring units represented by the formula:

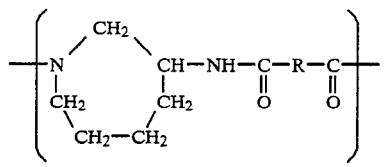

wherein R represents at least one divalent organic group.

The polyamide polymer constituting the resist of the present invention is known as to its structure or preparation method per se [see for example J. Polym. Sci. 16 3035–3038 (1978)]. However, utilization as a crosslinked resin thereof, especially for providing a resist film excellent in dry etching resistance by crosslinking by irradiation of an ionizing radiation is not known.

The present invention according to another aspect thereof provides an ionizing radiation lithography in which the above mentioned resist of the invention is used.

The nature, utility, and further features of this invention will be more clearly apparent from the following detailed description beginning with a consideration of general aspects of the invention and concluding with specific examples of practice thereof.

The terms "%" and "part" used hereinafter in connection with compositions are by weight unless otherwise specified.

DETAILED DESCRIPTION OF THE INVENTION

The group R in the polyamide polymer represented by the above formula is generally a divalent organic group, more particularly including groups providing dicarboxylic acids or chlorides thereof and groups derived therefrom. More specifically, examples of the group R include aliphatic saturated hydrocarbon groups such as —(CH$_2$)$_2$—, —(CH$_2$)$_3$—, —(CH$_2$)$_4$—, —(CH$_2$)$_5$—, etc.; olefinic hydrocarbon groups such as —CH$_2$CH=CHCH$_2$—, —CH$_2$CH=CHCH$_2$CH$_2$—, etc.; aromatic hydrocarbon groups such as

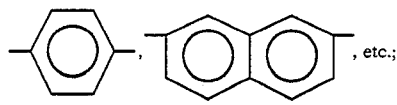, etc.;

divalent heterocyclic groups derived from heterocyclic compounds such as pyridine, furan, thiophen, etc.; epoxidized hydrocarbon groups derived from the above olefin type hydrocarbon groups such as

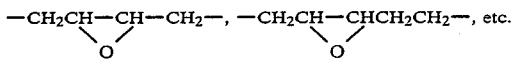

Among them, olefinic hydrocarbon groups, epoxidized hydrocarbon groups and heterocyclic groups are preferred for providing polyamide polymers with high sensitivity. The group R is not limited to only one group as exemplified above, but can include two or more kinds thereof. That is, the polyamide polymer can apparently assume the structure of a copolymer.

Preparation of the above polyamide polymer may be carried out according to a known method. For example, as disclosed in the above mentioned J. Polym. Sci. 16 3035-3038 (1978), it can be obtained by subjecting 3-aminoperhydroazepine (APA) represented by the formula:

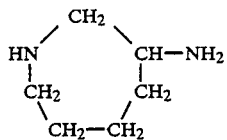

which is obtained by reduction of α-amino-ε-caprolactam and a divalent acid halide represented by the formula ClOR$^I$OCl to polycondensation by the interface reaction or in a solution in the presence of an acid acceptor such as a base, etc. An epoxy containing polyamide can be obtained for example by use of an olefinic hydrocarbon group as the group R$^I$ in the above acid chloride and introducing epoxy groups by partial oxidation of the unsaturated groups in the resultant polyamide.

From the reactions as mentioned above, a polyamide polymer having a molecular weight of 10,000 to 1,000,000 can be obtained.

The resist of the present invention is preferably constituted by the above polyamide polymer alone, but it may also be constituted, if desired, by a mixture of said polymer with other polymers well compatible with said polymer and having good solubility in solvents. Examples of such polymers include aliphatic polyamides such as 6-nylon, 6,6-nylon, etc. which may be solubilized by grafting through reaction, for example, with epoxy compounds. When used as a mixture, the polyamide polymer is used preferably at a proportion of 50% by weight or more based on the total weight with the other polymers.

Now, the lithographic process with the use of the resist of the present invention will be described below.

First, the resist of the present invention is dissolved, for example, in a lower alcohol such as methanol and ethanol, chloroform, and methyl cellosolve to prepare about 5 to 15% solution having a viscosity suitable for coating.

The resist solution is coated uniformly in a conventional manner by spinner coating, etc. on a semiconductor substrate or a mask substrate (blank) to be treated. Examples of appropriate semiconductor substrates include silicon substrates optionally covered with a thin layer of silicon dioxide, silicon nitride, polysilicon or aluminum. Examples of appropriate mask substrates (blanks) include a single-layer chromium (Cr) mask blank, two- or three-layer chromium mask blank with one or both surfaces of low reflection, see-through type mask blank comprising (i) a compound of silicon and silicon oxide or (ii) ferric oxide, single layer tantalum (Ta) mask blank, and two- or three-layer tantalum mask blank with low surface reflection and conductive mask blanks comprising an additional transparent electroconductive layer along with the above mentioned masking layers (such as Cr, Ta and silicon compound layers).

The thus coated substrate is then subjected to a pre-bake treatment, to form a resist film of a thickness of about 0.1-2 μm. The pre-bake conditions differ depending on the solvent employed. In general, a temperature of 70°-90° C. and a time of 20 to 40 minutes are suitable in case of lower alcohols.

Subsequently, at the desired portion of the resist film, an ionizing radiation such as an electron beam or soft X-rays is applied to accomplish pattern drawing, followed further by treatment with a developer to dissolve away selectively the unirradiated portions, thereby forming a resist pattern. As the developer, lower alcohols such as methanol and ethanol or solvent mixtures of these lower alcohols with benzene, chloroform, etc., are preferably employed. The thus formed resist pattern is preferably rinsed, for example, with an aromatic solvent such as benzene, toluene and xylene.

The substrate having the resist pattern after development may be subjected to the post-bake treatment and the scum elimination treatment, as desired, and thereafter subjected to etching to form an etching pattern at the exposed portion of the substrate. The post-bake treatment may be conducted, for example, at a temperature of 120°-140° C. for 20-40 minutes. On the other hand, the scum elimination treatment can be conducted, for example, with the use of an oxygen plasma under the conditions of a pressure of 0.9-1 Torr and an output of 100 W for 1-2 minutes.

For etching, either wet etching or dry etching may be applicable, but dry etching suitable for micropatternization is desirable for working of a semiconductor substrate or a mask substrate of high integration degree. As described above, the crosslinked resist film of the resist according to the present invention is excellent in dry etching resistance and therefore particularly suitable in this respect. Etching may be conducted with the use of a halogen containing gas such as carbon tetrachloride, carbon tetrafluoride, etc. or a gas mixture of these gases with oxygen. For example, when the patternized film of the thus prepared resist of the present invention is formed on a chromium mask substrate and subjected to dry etching at the exposed chromium portion with a chlorine type gas such as carbon tetrachloride, the film reduction speed of the resist film is equal to the value of the photoresist of a novolac type phenol resin which has very excellent dry etching resistance. While the phenol type resist as mentioned above has high dry etching resistance, which is considered to be due to the benzene rings possessed in the molecular structure, the resist of the present invention containing no benzene ring can exhibit excellent dry etching resistance, probably because of the hydrogen bonding force between amide bondings. For this reason, the resist film of the present invention is generally excellent in physical or mechanical characteristics.

The etching conditions are basically known for respective semiconductor or mask substrates to be processed. Examples of etchants to be used in combination with the resist of the invention include dry etchants such as carbon tetrachloride (suitable for Cr masks and Al films), carbon tetrafluoride (for Ta masks, $SiO_2$ films, $Si_3N_4$ films and poly-Si films), these gases being used together with a minor amount of oxygen, as desired, and wet etchants such as $(NH_4)_2Ce(NO_3)_6$ dissolved in dilute perchloric acid (for Cr masks) and $AgNO_3 + NH_4F$ dissolved in dilute nitric acid (for Si+-$SiO_2$ compound films).

After etching, the remaining resist pattern is removed, for example, by peeling-off or burning with an oxygen plasma. Thus, one cycle of the lithographic steps is completed.

As described above, according to the present invention, there is provided a negative-type resist sensitive to ionizing radiation which is highly practical and suitable for production of a highly integrated semiconductor circuit or photomask for which dry etching is essentially required for micropatternization, because it has high sensitivity as well as high resolving power and also has excellent dry etching resistance.

In order to indicate fully the nature and utility of this invention, the following examples are set forth, it being understood that these examples are presented as illustrative only and are not intended to limit the scope of the invention.

EXAMPLE 1

13.6 g (0.12 mole) of 3-Amino-perhydroazepine (APA) was dissolved in 600 cm³ of an aqueous solution containing 0.24 mole of sodium hydroxide, and the resultant solution was charged together with a solution of 21.7 g (0.12 mole) of trans-2-butene-1,4-dicarboxylic acid chloride dissolved in 600 cm³ of benzene into a reactor. Interfacial polymerization was carried out while cooling externally the reactor under high speed stirring for 5 minutes. The precipitates formed were recovered, dissolved in a solvent mixture of methanol and benzene, reprecipitated with acetone, followed by filtration recovery to obtain a polymer (HC) represented by the following formula:

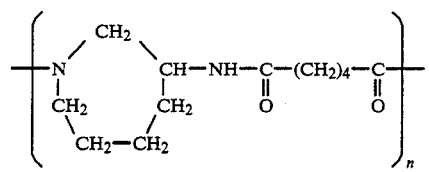

The polymer obtained had a solution viscosity ($\eta_{sp}/c$) of 130 cm³/g in 0.1 g/10 cm³ solution in conc. sulfuric acid at 30° C. The estimated molecular weight was about 34,000.

The above polymer (HC) was dissolved in methanol and filtered through a 0.2 μm filter for removal of solids to obtain a resist solution of 8% concentration.

The resist solution was coated on a chromium mask substrate (blank) by the spinner coating method and prebaked at 90° C. for 30 minutes to obtain a uniform resist film of a thickness of 6,000 Å. Then, on the resist film, an electron beam of a beam radius of 0.25 μm and an energy of 10 KeV was projected in a dose of $5 \times 10^{-6}$ coulomb/cm² to carry out pattern drawing thereon. Further, the resist film was developed by treatment with methanol for one minute, followed by rinsing with isopropyl alcohol for one minute, to form a resist pattern.

As the next step, the substrate having the resist pattern obtained was post-baked at 140° C. for 30 minutes and thereafter subjected to the scum elimination treatment with an oxygen plasma of a pressure of 1 Torr and an output of 100 W for one minute. The substrate was then subjected to etching at the exposed portion of the chromium film according to the reactive sputter etching method with a gas mixture of $CCl_4$ and $O_2$ under a pressure of $3 \times 10^{-1}$ Torr and an output of 300 W for 5 minutes. The film reduction speed of the resist pattern was found to be 250 Å/min., thus indicating sufficient dry etching resistance.

After etching, the substrate was immersed in a film-peeling solution of a sulfuric acid-hydrogen peroxide mixture at 70° C. for 5 minutes, and thereafter the resist pattern film was peeled off to obtain a photomask having a chromium pattern comprising 1 μm lines and spaces.

EXAMPLE 2

The procedure of Example 1 was repeated except that 22 g (0.12 mole) of adipic acid chloride was used in place of trans-2-butene-1,4-di-carboxylic acid chloride to obtain a polymer (AC) represented by the following formula at a yield of about 40%.

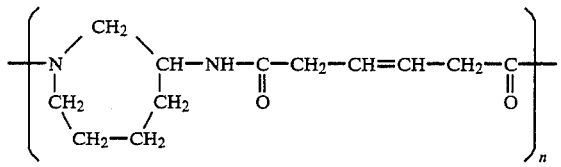

The above polymer had a viscosity of 120 cm³/g in 0.1 g/10 cc conc. sulfuric acid solution at 30° C. The estimated molecular weight was about 27,000.

The above polymer (AC) was dissolved in methanol and removed of solids to obtain a resist solution of 10% concentration.

The resist solution was coated on a wafer having a silicon oxide film by the spinner coating method, and pre-baked at 80° C. for 30 minutes to form a uniform resist film of a thickness of 1 μm. Then, the resist film was irradiated with an electron beam of an energy of 10 KeV in a dose of $8 \times 10^{-5}$/cm² and developed with ethanol, which step was followed by rinsing with xylene, to form a resist pattern.

Subsequently, after performing the post-bake treatment and the scum elimination treatment similarly as in Example 1, plasma etching was carried out similarly as in Example 1 except for using a gas mixture of $CF_4$ and oxygen. After etching, the resist film was peeled off to obtain a wafer having a patternized silicon oxide film.

EXAMPLE 3

The procedure of Example 1 was repeated except that 11 g (0.06 mole) of adipic acid chloride and 10.9 g (0.06 mole) of trans-2-butene-1,4-dicarboxylic acid chloride were used in place of 21.7 g (0.12 mole) of trans-2-butene-1,4-dicarboxylic acid chloride to obtain a polymer represented by the following formula at a yield of about 35%.

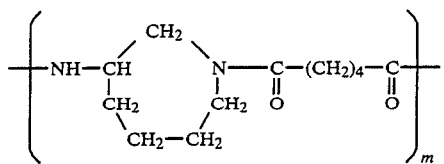

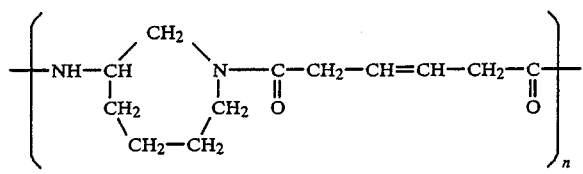

wherein m and n are ratios of the respective units contained in the copolymer (i.e. compositional ratio), the above polymer actually being a random copolymer.

The polymer obtained had a viscosity of 100 cm$^3$/g in conc. sulfuric acid solution (0.1 g/10 cm$^3$, 30° C.), with the estimated molecular weight being about 23,000.

The compositional ratio m/n of the copolymer obtained was approximately 1.

The polymer was dissolved in methyl cellosolve to obtain a 8% resist solution, which was then coated and dried. The resist film obtained of a thickness of 0.6 μm was subjected to pattern irradiation by an electron beam of 10 KeV and developed with methanol. As the result, it exhibited a sensitivity of $2 \times 10^{-5}$ coulomb/cm$^2$ (dose when the residual film percentage after resist development is 50%), which was substantially middle value between those of Example 1 and Example 2, and dry etching resistance was also good.

By varying the ratio of the adipic acid chloride to trans-2-butene-1,4-dicarboxyic acid chloride employed in the above reaction, the ratio m/n in the above formula was changed continuously. Corresponding to such a compositional change, the sensitivity was also confirmed to vary continuously within the range of from $8 \times 10^{-6}$ to $100 \times 10^{-6}$ coulomb/cm$^3$ in the range of the estimated molecular weight of from 20,000 to 30,000.

EXAMPLE 4

The polymer (HC) obtained in Example 1 was dissolved in chloroform and further equal mole of m-chlorobenzoic acid was added to the solution to epoxidize a part of the double bonds in the polymer (HC). A copolymer having the following formula was obtained:

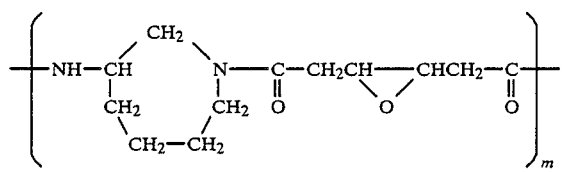

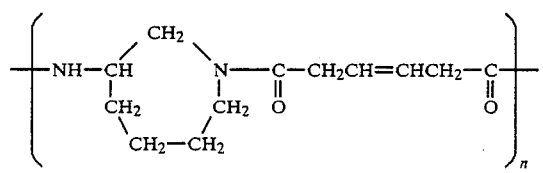

wherein, m and n have the same meanings as explained above.

The epoxy content in the resultant copolymer, namely m/(m+n) was found to be about 30%.

The above copolymer was dissolved in methyl cellosolve to prepare a 6% resist solution, then the procedure of Example 3 was repeated except for use of a solvent mixture of equal volumes of methanol and chloroform as developer, and thereafter sensitivity measurement was conducted. As a result, the resist film exhibited a sensitivity of $8 \times 10^{-6}$ coulomb/cm$^3$, and also a good dry etching resistance.

EXAMPLE 5

5 g of 6-Nylon having a molecular weight of about 15,000 was dissolved under heating in a solution of 25 g of calcium chloride and 50 cc of methnol. Nitrogen was blown into the solution for 30 minutes, 0.1 g of azobisisobutyronitrile was added and the mixture was stirred for additional one hour. Then, 12.5 g of glycidyl methacrylate which amount is two times as much in terms of moles as that of the 6-nylon and 1.2 g of methacrylic acid were added to the mixture, and the reaction was carried out in nitrogen atmosphere at 60° C. for 7 hours. The reaction mixture was poured into water, and the precipitates recovered were purified with acetone to synthesize a polymer having a solution viscosity of 83 cm$^3$/g (30° C., 0.1 g/10 cm$^3$ in dichloroacetic acid) with a grafting percentage of 66%.

One part of the above polymer and two parts of the polymer (HC) obtained in Example 1 were dissolved in a solvent mixture of methyl ethyl ketone/formic acid=1:5 and thoroughly blended, followed by filtration to obtain a resist solution of 5% concentration. Sensitivity measurement was conducted by following the procedure of Example 3 except for using this resist solution and the above methyl ethyl ketone/formic acid solvent mixture as developer. As a result, a sensitivity of $8 \times 10^{-6}$ coulomb/cm$^2$ was obtained.

I claim:

1. A negative-type resist solution, which comprises (i) a polyamide polymer sensitive to ionizing radiation, said polyamide polymer having a molecular weight of from 10,000 to 1,000,000 and having recurring units represented by the formula:

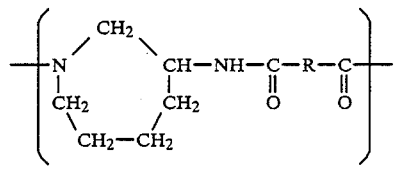

wherein R represents at least one divalent organic group selected from the group consisting of olefinic hydrocarbon groups, divalent heterocyclic groups, and epoxidized hydrocarbon groups, and (ii) a solvent, wherein the concentration of said polyamide polymer in said resist solution is from 5 to 15 weight %.

2. A negative-type resist solution according to claim 1, wherein R consists of two or more organic groups, and the polyamide polymer takes the form of a copolymer.

3. A negative-type resist sensitive to ionizing radiation, which comprises a mixture of a polyamide polymer having the recurring units represented by the formula:

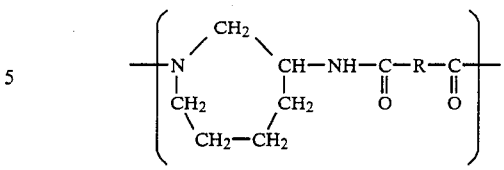

wherein R represents at least one divalent organic group with another polymer compatable therewith.

4. A negative-type resist solution according to claim 3, wherein said another polymer is an epoxidized aliphatic polyamide.

5. A negative-type resist solution according to claim 1, wherein said solution is selected from lower alcohols, chloroform, methyl cellosolve and mixtures thereof.

* * * * *